United States Patent
Landau et al.

(10) Patent No.: US 8,448,053 B2
(45) Date of Patent: *May 21, 2013

(54) METHOD AND SYSTEM FOR DATA-RATE CONTROL BY RANDOMIZED BIT-PUNCTURING IN COMMUNICATION SYSTEMS

(75) Inventors: Uri M. Landau, San Diego, CA (US); Mark Kent, Vista, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/457,391

(22) Filed: Apr. 26, 2012

(65) Prior Publication Data

US 2012/0210186 A1    Aug. 16, 2012

Related U.S. Application Data

(63) Continuation of application No. 12/101,365, filed on Apr. 11, 2008, now Pat. No. 8,171,383.

(60) Provisional application No. 60/923,245, filed on Apr. 13, 2007.

(51) Int. Cl.
*H03M 13/03* (2006.01)

(52) U.S. Cl.
USPC ............................. 714/790; 714/781

(58) Field of Classification Search
USPC .................. 714/781, 784, 790, 800
See application file for complete search history.

(56) References Cited

U.S. PATENT DOCUMENTS

| | | | | |
|---|---|---|---|---|
| 6,111,912 A * | 8/2000 | Cohen et al. | | 375/225 |
| 6,430,722 B1 * | 8/2002 | Eroz et al. | | 714/755 |
| 7,096,404 B2 * | 8/2006 | Eroz et al. | | 714/755 |
| 7,281,197 B2 * | 10/2007 | Li | | 714/790 |
| 7,743,312 B2 * | 6/2010 | Choi et al. | | 714/790 |
| 7,987,414 B2 * | 7/2011 | Kim et al. | | 714/790 |
| 8,171,383 B2 * | 5/2012 | Landau et al. | | 714/790 |
| 2004/0054960 A1 * | 3/2004 | Eroz et al. | | 714/800 |
| 2006/0090120 A1 * | 4/2006 | Chen | | 714/790 |
| 2006/0206781 A1 * | 9/2006 | Choi et al. | | 714/758 |
| 2007/0101243 A1 * | 5/2007 | Kim et al. | | 714/790 |

* cited by examiner

*Primary Examiner* — Joshua Lohn

(74) *Attorney, Agent, or Firm* — Garlick & Markison; Shayne X. Short

(57) ABSTRACT

Method and system for data-rate control by randomized bit-puncturing in communication systems. An encoder encodes at least one information bit thereby generating a group of encoded bits or an encoded frame. The encoder may be any type of encoder including a turbo encoder, an LDPC (Low Density Parity Check) encoder, a RS (Reed-Solomon) encoder, or other type of encoder. Any sub-portion of an encoded frame generated by such an encoder can be viewed as being a group of encoded bits. If the encoded frame is sub-divided into multiple groups of bits, each group can under processing in accordance with the means presented herein to effectuate rate matching. Based on a number of bits to be punctured from the group or frame generated by the encoder, a set of pointers and random-generated displacements is used to generate addresses for bits in the group or frame to be transmitted or punctured.

20 Claims, 11 Drawing Sheets

METHOD AND SYSTEM FOR DATA-RATE CONTROL BY RANDOMIZED BIT-PUNCTURING IN COMMUNICATION SYSTEMS

CROSS REFERENCE TO RELATED PATENTS/PATENT APPLICATIONS

Continuation Priority Claim, 35 U.S.C. §120

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility patent application Ser. No. 12/101,365, entitled "Method and system for data-rate control by randomized bit-puncturing in communication systems," filed Apr. 11, 2008, pending, and scheduled to be issued as U.S. Pat. No. 8,171,383 on May 1, 2012 (as indicated in an ISSUE NOTIFICATION mailed on Apr. 11, 2012), which claims priority pursuant to 35 U.S.C. §119(e) to the following U.S. Provisional Patent Application which is hereby incorporated herein by reference in its entirety and made part of the present U.S. Utility Patent Application for all purposes:

1.1. U.S. Provisional Patent Application Ser. No. 60/923,245, entitled "Method and system for data-rate control by randomized bit-puncturing in communication systems," filed Apr. 13, 2007.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

DETAILED DESCRIPTION OF THE INVENTION

Figure 1:
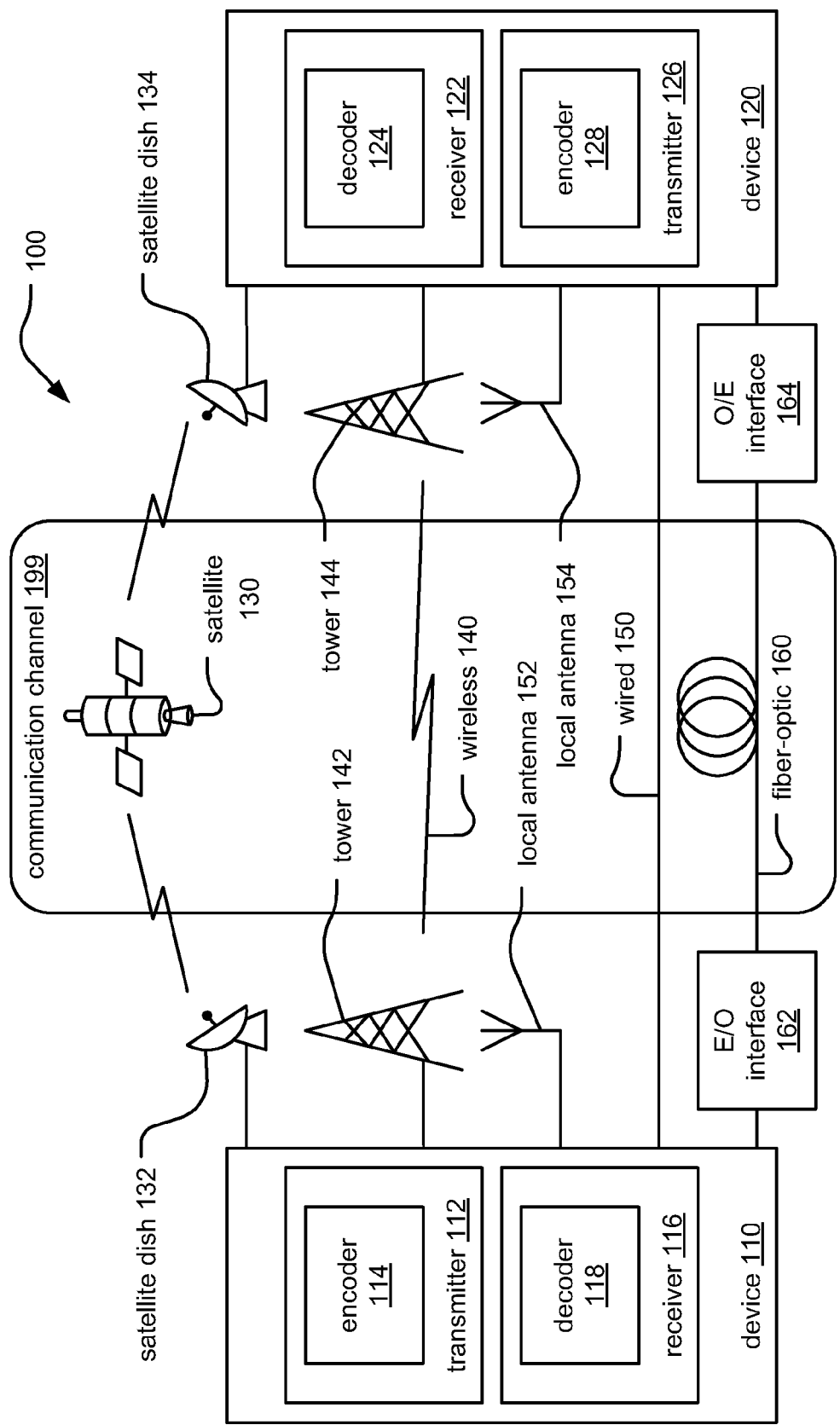
FIG. 1 illustrates an embodiment of a communication system.

Many communication systems can incorporate the use of a turbo code. Means are presented herein that can be applied generally across any of a wide variety of communication systems employing turbo codes. In certain embodiments, the principles presented herein can be applied to communication systems comporting with the 3GPP channel code.

The Universal Mobile Telecommunications System (UMTS) in its third generation (3G) is intended to provide with wide range of services including telephony, paging, messaging, Internet and broadband data. International Telecommunication Union (ITU) started the process of defining the standard for third generation systems, referred to as International Mobile Telecommunications 2000 (IMT-2000). In Europe European Telecommunications Standards Institute (ETSI) was responsible of UMTS standardization process. In 1998 Third Generation Partnership Project (3GPP) was formed to continue the technical specification work. 3GPP has five main UMTS standardization areas: Radio Access Network, Core Network, Terminals, Services and System Aspects and GERAN.

3GPP work on the Evolution of the 3G Mobile System started with the RAN Evolution Work Shop, 2-3 Nov. 2004 in Toronto, Canada. The Work Shop was open to all interested organizations, members and non members of 3GPP. Operators, manufacturers and research institutes presented more than 40 contributions with views and proposals on the evolution of the Universal Terrestrial Radio Access Network (UT-RAN).

Turbo coding was suggested for 3GPP LTE channel coding. Additional information regarding the UTRA-UTRAN Long Term Evolution (LTE) and 3GPP System Architecture Evolution (SAE) can be found at the following Internet web site:

www.3gpp.org

Along these lines, the turbo decoding of this system can be implemented using a parallel decoding arrangement because of the very high data throughput and large block size desired for 3GPP LTE channel coding. The parallel decoding requires the collision-free memory accessing (i.e., any one turbo decoder (of a group of parallel arranged turbo decoders) accesses only memory (of a group of parallel arranged memories) at any given time).

Considering another already developed standard, High Speed Downlink Packet Access (HSDPA) and High Speed Uplink Packet Access (HSUPA) technologies are already standardized and are undergoing network trials with operators in the Far East and North America. Promising theoretical downlink speeds as high as 14.4 Mbps (and respectively 5.8 Mbps uplink), these technologies will play an instrumental role in positioning 3G/UMTS as a key enabler for true 'mobile broadband'.

With the conclusions of this Work Shop and with broad support from 3GPP members, a feasibility study on the UTRA & UTRAN Long Term Evolution was started (LTE) in December 2004. The objective was "to develop a framework for the evolution of the 3GPP radio-access technology towards a high-data-rate, low-latency and packet-optimized radio-access technology" The study focused on supporting services provided from the PS-domain, involving the following:

Related to the radio-interface physical layer (downlink and uplink):
  (e.g., means to support flexible transmission bandwidth up to 20 MHz, introduction of new transmission schemes and advanced multi-antenna technologies)
Related to the radio interface layer 2 and 3: e.g. signaling optimization
Related to the UTRAN architecture:
  identify the optimum UTRAN network architecture and functional split between RAN network nodes and RF-related issues
The wide set of options initially identified by the early LTE work was narrowed down, in December 2005, to a working assumption that the downlink would use Orthogonal Frequency Division Multiplexing (OFDM) and the uplink would use Single Carrier-Frequency Division Multiple Access (SC-FDMA).
The use of Multiple Input Multiple Output (MIMO) scheme was agreed, with possibly up to four antennas at the mobile side, and four antennas at the Cell site.
Peak Data Rate
Instantaneous downlink peak data rate of 100 Mb/s within a 20 MHz downlink spectrum allocation (5 bps/Hz).
Instantaneous uplink peak data rate of 50 Mb/s (2.5 bps/Hz) within a 20 MHz uplink spectrum allocation).

A critical element in deploying a mobile network is the closed-loop operation between the Node-B (base-station) and the UE (User Equipment, the mobile station such as a hand-held communication device). An example for closed loop operation is the regulation of the Uplink power transmission (from the UE to Node-B). In this case, Node-B transmits, on a control channel, commands to each UE, it communicates, to adjust its transmitted power to a desire value such that generates minimal interference while maintaining good communication.

A more advanced closed loop operation (in addition to the one mentioned) is based on reporting to the base-station the channel quality indicator (CQI) that a UE has. For example, in the HSDPA based network, the CQI is based on the received data SNR (Signal/Noise Ratio). Node-B uses this information to define the code puncture-rate and the type of modulation to be used in the next transmit packet.

In mobile network such as proposed by the LTE project, advances techniques such MIMO transmit/receive, the multifold increase in the data rate coupled with the reduction in Node-B time response creates a wide scope of services that require the redefinition and generalization of the required feedback such as CQI.

Generally speaking, the goal of digital communications systems is to transmit digital data from one location, or sub-system, to another either error free or with an acceptably low error rate. As shown in FIG. 1, data may be transmitted over a variety of communications channels in a wide variety of communication systems: magnetic media, wired, wireless, fiber, copper, and/or other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199.

In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Within the context of the invention, the encoder-decoder pair represents a general process whereby a data bit is partitioned into several cascaded sub-bits and then a mapping rule (namely, encoding) is applied either continuously or to a frame or block of sub-bits. At the receiver, the inversed mapping rule is applied to the received stream in order to recover the original information bits. Such a process may include multiple cascaded mapping blocks or parallel mapping blocks, or their combination. It also may include randomizers (interleavers) and de-randomizers in the received side. Furthermore, on the received side, in the process of recovering the data, the process of de-mapping (decoding) is done over what is known in the art as soft-bits or soft-decision bits.

Throughout this presentation, a Turbo decoder-encoder, as it is used in the well known standard HSDPA (High-speed Downlink Packet Access), is referred to as an example. However, one who is learned in the art may apply the invention to other communication apparatus.

Figure 2:
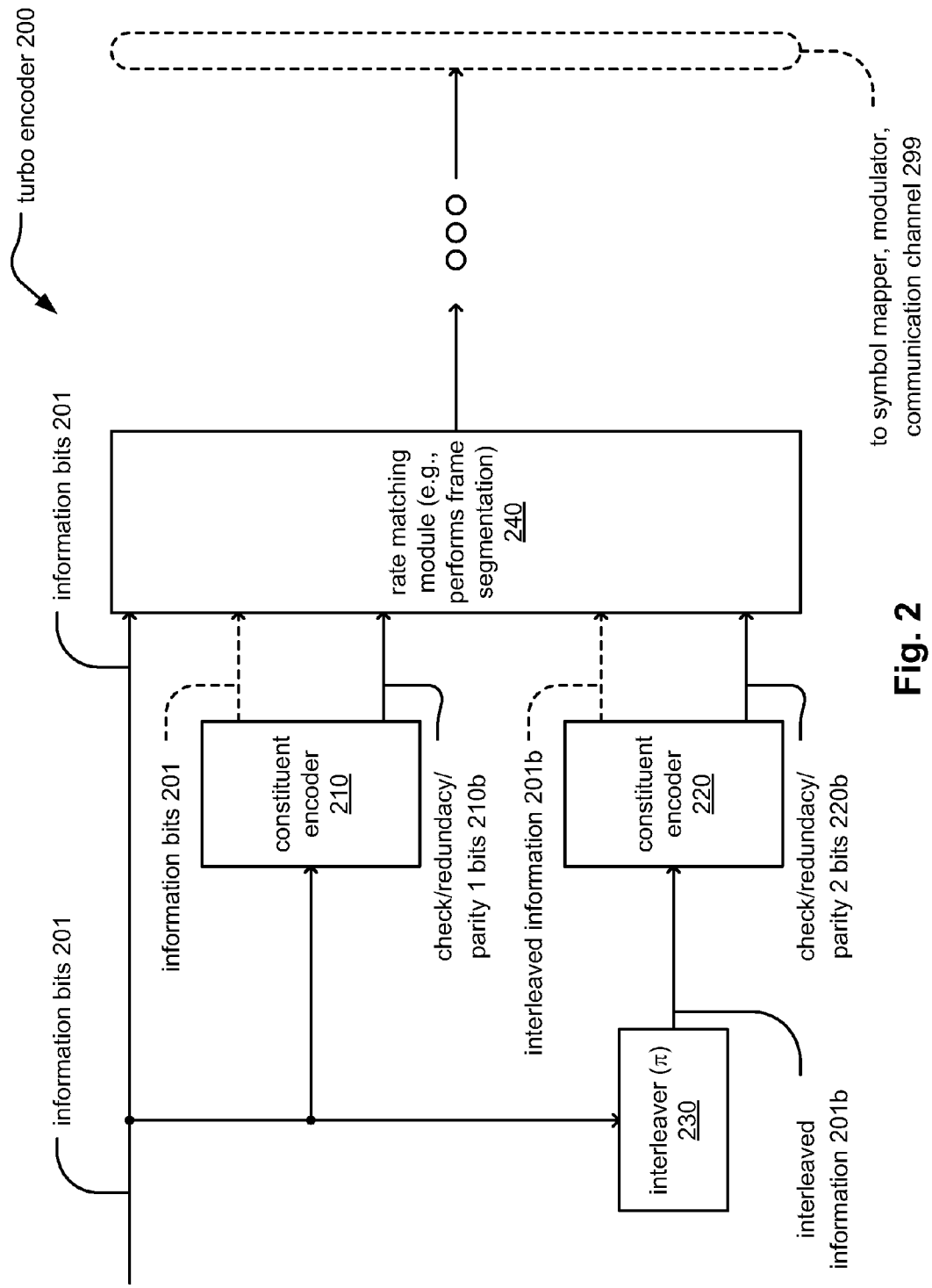
FIG. 2 illustrates an embodiment of a turbo encoding module.

FIG. 2 illustrates an embodiment of a turbo encoding module 200. Information bits are provided to an interleaver ($\pi$) module 230 that is operable to generate interleaved information 201$b$. The interleave ($\pi$) employed by the interleaver ($\pi$) module 230 can be a QPP interleave ($\pi$) in some embodiments. Alternatively, other desired interleaves ($\pi$) can be employed by the interleaver ($\pi$) module 230 without departing from the scope and spirit of the invention.

These information bits 201 are also passed to a first constituent encoder 210 from which both the information bits 201 as well as check/redundancy/parity 1 bits 210$b$ are output there from.

The interleaved information 201$b$ output from the interleaver ($\pi$) module 230 is also passed to a second constituent encoder 220 from which both the interleaved information 201$b$ as well as check/redundancy/parity 2 bits 220$b$ are output there from.

In the art, the parity bits output from a turbo encoder are sometimes referred to as check bits, parity bits, and/or redundancy bits. Moreover, the information bits output from a turbo encoder are sometimes referred to as the information bits (i.e., the very same as was provided to the turbo encoder) and also as systematic bits (e.g., in the context of a systematic encoder that, when encoding information bits, outputs those same information bits as well as check/redundancy/parity bits). Herein, parity bits and is oftentimes employed for reference to these check/redundancy/parity bits output from a turbo encoder, and information bits is oftentimes employed for reference to these information/systematic bits output from a turbo encoder.

Each of the information bits 201, the parity 1 bits 210$b$, and the parity 2 bits 220$b$ is provided to a rate matching module 240 (e.g., that performed frame segmentation). Various other components can also be situated as part of or after the rate matching module 240 to assist in the generation of an encoded block that may then be passed to a symbol mapper where the symbols are mapped according to the appropriate modulation (constellation and mapping). These symbol mapped symbols may then undergo any appropriate modulation as required to generate a continuous-time signal whose format comports with a communication channel into which the turbo coded signal is to be launched.

Figure 3:
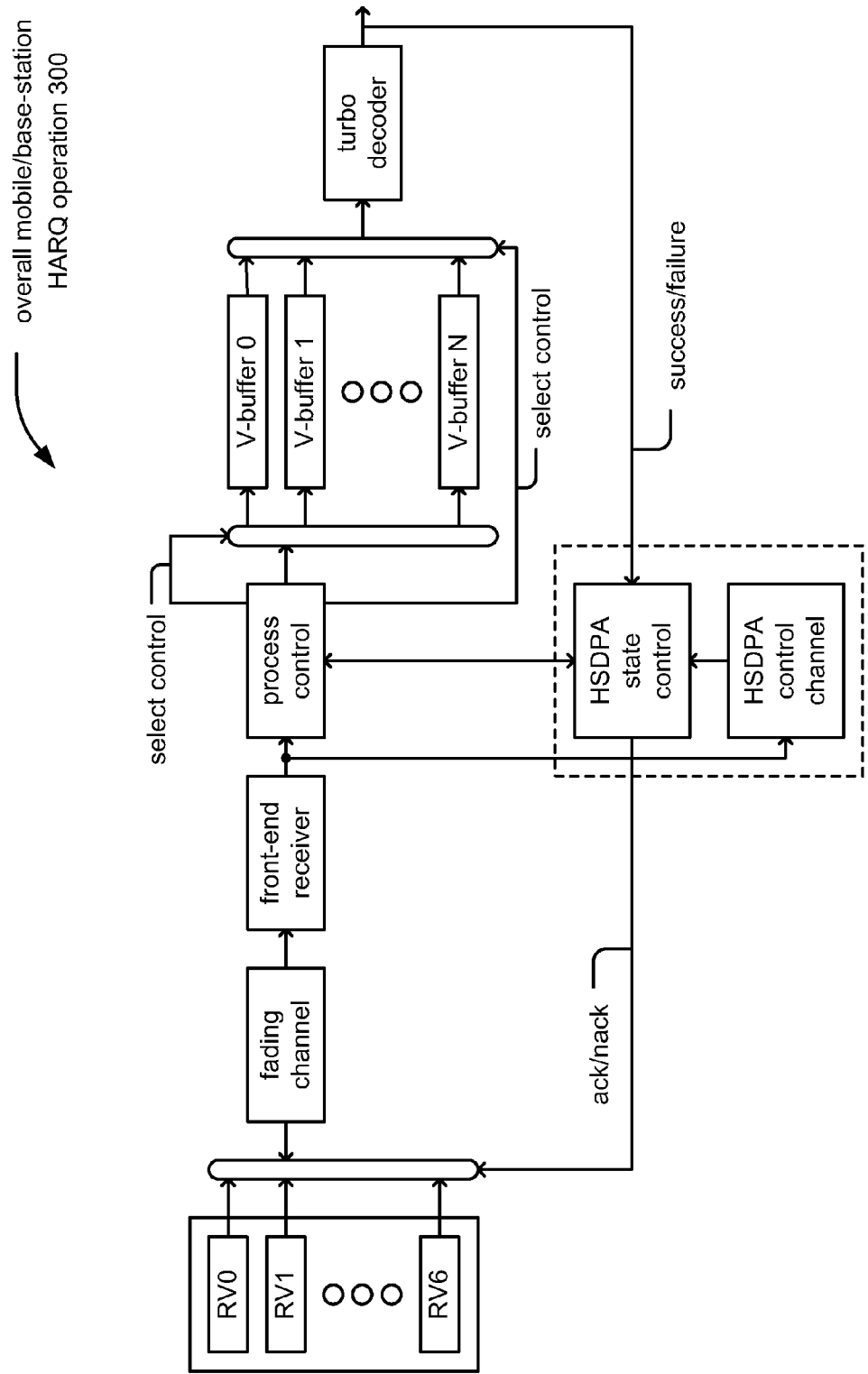
FIG. 3 illustrates an exemplary embodiment of a communication system showing the overall mobile/base-station HARQ operation.

FIG. 3 illustrates an exemplary embodiment of a communication system 300 showing the overall mobile/base-station HARQ operation. This diagram shows, among other things, the process that takes place between a UE (User Equipment or a mobile) and the base station (also known as node B).

Re-Transmitting TTI (Time Transmit Interval) HARQ-Process Concept

A received data block is maintained in the Virtual buffer till it is decoded or it has re-transmitted the pre-defined transmit times. Usually, a standard allows the UE to request a new block of data before the decoding of the 1$^{st}$ data block. The 2$^{nd}$ data block is maintained in the 2$^{nd}$ Virtual buffer. The process of completion the decoding of a unique data block is defined as an HARQ (Hybrid Automatic Request) process.

The number of processes (times the bit-load a process bear) a UE can handle, implies a data throughput capability and requires a certain number of Virtual buffers (and size). The total number of bits (soft bits) available for the Virtual buffers is known as the total SML's (Soft Metric Location). This term is used to categorize the UE capability, for example, in the HSDPA standard.

Conceptually, a Master Process maintains the status of each process, receives the Decoder Flag (Failure/Success to decode a TTI block), accordingly sends Nack/Ack (negative acknowledgement/acknowledgement) to the BS (Base Station), sets the Process Control for receiving the next data block (see diagram).

A retransmit packet is always combined—in the V-buffer—with the previous received block(s); otherwise the buffer is cleared before storing a new block of data.

Redundancy Version (RV)

Figure 4:
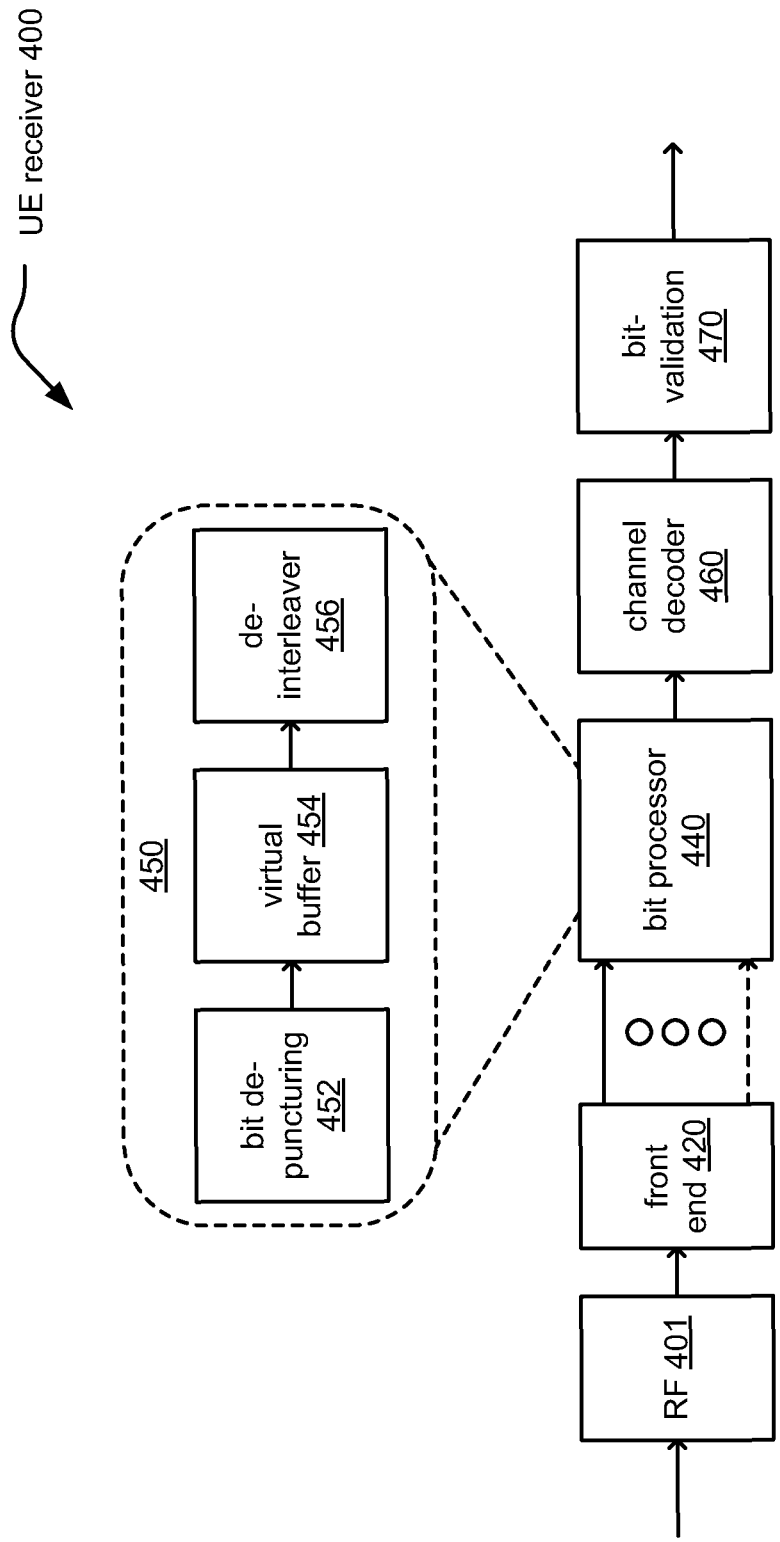
FIG. 4 illustrates an exemplary embodiment of a UE receiver.

FIG. 4 illustrates an exemplary embodiment of a UE (User Equipment) receiver 400. This operation facilitates the mapping of the received bits to their original locations in the data block. That is to say, each transmit, the soft-decision bits are combined with the previous transmits. Consequently, the reliability of the received data is improved and therefore increases the likelihood of successful decoding. This concept facilitates a throughput that is tailored to a specific mobile—thus provides a mean to diversify services the network provides optimally (minimal resources allocation).

The RV concept implies that only part of the encoded block may be transmitted. It provides the network the flexibility to match specific UE capabilities and geometry conditions (e.g. distance form from Node B) with appropriate data-rate. For example a UE-A that suffers from bad reception may receive encoded frame of fewer data bits than a UE-B that is in a good reception state. In the case of UE-A, for each data bit, two parity sub-bits may be added (referring to the example of Turbo encoder-decoder shown here). In the case of UE-B, for each data bit, the number of parity sub-bits may be reduced to a fraction (a parity sub-bit per several data bits). In the case of UE-A, we say that the coding rate is ⅓. In the case of UE-B, the coding rate is higher and may approach 1.

Following the literature, and for simplification, a "sub-bit" will henceforth in this disclosure be referred to as a "bit", whether a data (systematic) bit or a parity bit.

The process of removing certain bits before transmission—either from the parities groups or from the systematic group—and the remapping of the received bits to their original addresses is known in the art as puncturing and de-puncturing. This process facilitates the soft-combining of subset of received bits with previous received frames that are stored in the virtual buffer. FIG. 4 is a simplified block diagram shows the flow of data at the mobile. Signal is received through an antenna and brought to baseband in radio frequency (RF) module 401. It is further processed in front end 420 to a form of soft-bits. A bit processor 440 then receives one or more streams from the front end 420. A module 450 shows the processing in the bit processor 440; the module 450 includes a de-punctured block 452, a virtual buffer 454, and a de-interleaver ($\pi^{-1}$) 456.

The soft-bits are de-punctured in block 452 (where de-puncturing means remapping the bits to their original addressing with zeros embedded in location for the punctured bits). The de-punctured block 452 is combined with previous transmit—if it is retransmit; or it is stored in the virtual buffer 454 if it is the 1$^{st}$ transmit. The block is de-interleaved using de-interleaver ($\pi^{-1}$) 456 and decoded in channel decoder 460. If decoding is successful (shown as bit-validation 470), a request of new packet is made. Otherwise, a retransmit is required.

Several methods and schemes—that entail how to choose consequence of subset of a transmitted packet—are available in literature and communication standards.

For example two known forms of HARQ: includes Chase combining and Incremental Redundancy (IR). In addition, the IR scheme can be full or partial. Chase combining is a simplified form of HARQ wherein the receiver simply requests retransmission of the original codeword again. IR is more complicated in that it provides for a retransmission of the code word using more or different parity bits (than were present during the previous transmission), lowering the overall combined code rate. A repetition or puncturing pattern in the parity bits can be defined using a classical code puncturing matrix, as is known in the art, or a rate matching algorithm to maintain the code rate of the physical channel. Some of the disadvantages of the HSDPA rate matching scheme (or puncturing scheme) is the need to store a full packet before the de-puncturing process can start—causing a delay and increase complexity due to buffer requirements.

Figure 5:
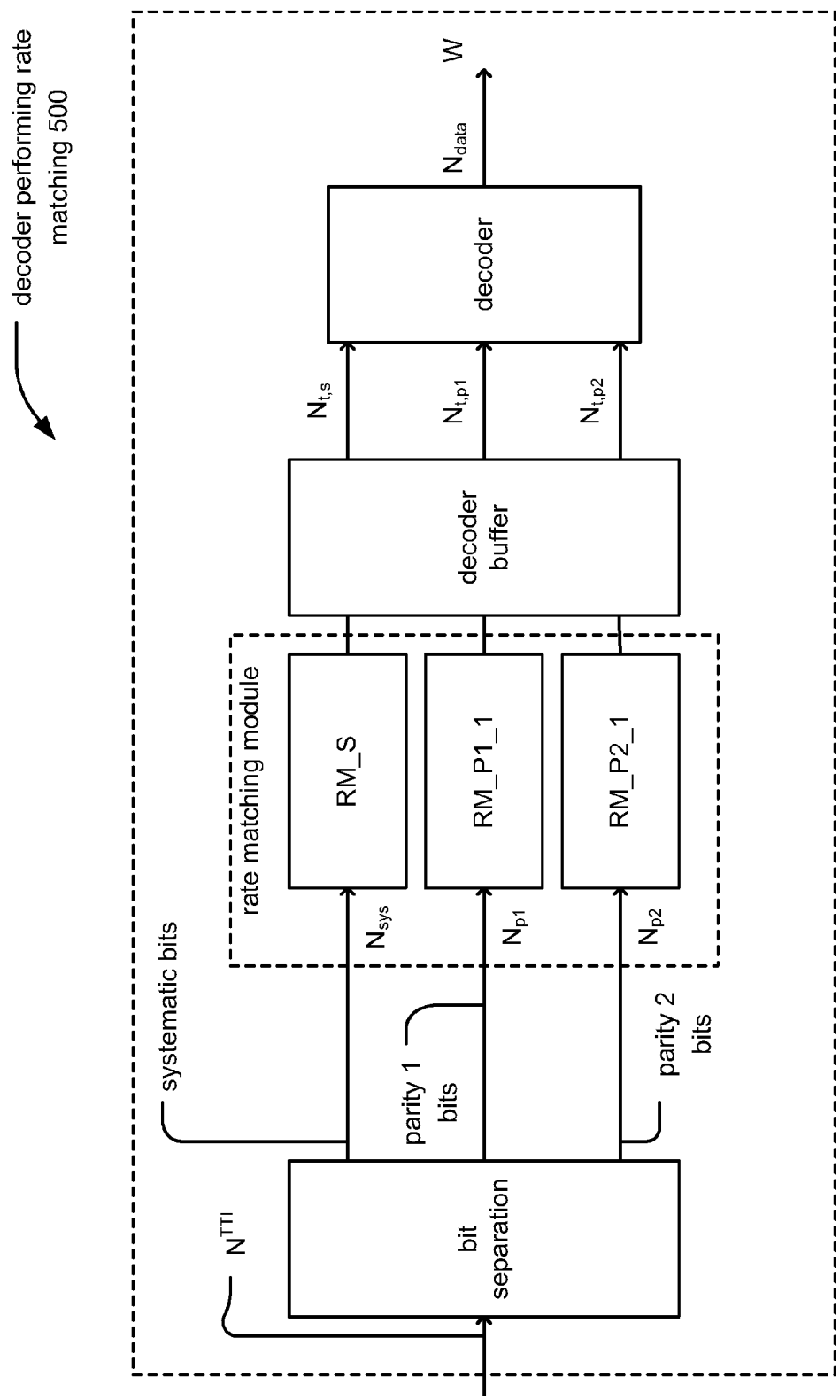
FIG. 5 illustrates an embodiment of a decoder performing rate matching.

FIG. 5 illustrates an embodiment of a decoder 500 performing rate matching.

A novel approach is presented herein for a unified puncturing scheme, which provides an improved frame error rate using an incremental redundancy technique that maximizes orthogonal redundancy among versions available for transmission, the combination of which result in a uniform puncturing pattern throughout the decoder trellis.

Referring again to FIG. 5, this diagram is exemplary block diagram of the proposed scheme (from the received side). The coded frame is separated into three groups (or as the case may be): systematic, parity-1, and parity-2. However, the decoder buffer and the buffer known in the art as the virtual buffer (the buffer where the combined received soft-bits are stored) are identical in this embodiment. Furthermore, the processing shown in FIG. 5 is completely virtual—enables the received bits—as it is received to be combined and stored in its address.

The following is an exemplary embodiment that demonstrates certain aspects of the invention where the transmitted block consists of Nsys bits—the number of data and two parity bits (see FIG. 5) Np1 and Np2. Let us assign Nt0=Nsys; Nt1=Np1 and Nt2=Np2.

Given Nt, the complete encoded frame length (without the tail bits);

$$Nt = Nt0 + Nt1 + Nt2;$$

In general:

$$Nt = \text{sum}\{Nt\_i\}; i=0:Ng-1;$$

Given the resource Nh—the number of available bits to be transmitted $$Nh = Nh0 + Nh1 + Nh2;$$

where Nh0, Nh1 and Nh2 are the number of the systematic, parity-1 and parity-2 respectively to be transmitted. In general:

$$Nh = \text{Sum}\{Nh\_i\}; i=0:Ng-1.$$

where Ng is the number of groups of bits to be punctured. E.g. in the exemplary case here Ng=3.

Therefore, out of Nt bits that are generated by the encoder Nh bits can be transmitted. Note that Nh may be larger than Nt; in this case the process is called repetition. Nh may be equal Nt; in this case we say that there is no puncturing, or, Nh may be smaller than Nt; in this case we say that puncturing process is taken place.

Define Npunc_i; as the number to puncture in group-0 (systematic), group-1 (parity-1) and group-2 (parity-2). We have:

$$Npunc\_i = Nt\_i - Nh\_i; i=0:Ng-1$$

For each group-i find the minimum:

$$Nph\_i = \min(Npunc\_i, Nh\_i)$$

Note that Nph_i is always less or equal ½Nt_i. It represents the total number of bits in the group-i to be transmitted or punctured.

In order to resolve this ambiguity, we define a flag Punc_i_flg:

if $Npunc\_i < Nh\_i$, Punc_i_flg=1;

else Punc_i_flg=0;

The interpretation is that if Punc_i_flg==1; the punctured set in group-i is the group to be selected. The rest will be transmitted. However, if Punc_i_flg==0; the transmitted set is the set to be selected; the rest of the bits in the group are punctured.

Next we define a grid distance Ns_i. If Nph_i>0:

$$Ns\_i = \text{floor}(Nt\_i/Nph\_i)$$

where floor is the function that returns the minimum integer of the ratio (Nt_i/Nph_i). As stated above Ns_i is 2 or greater.

If Nph_i==0, then if Punc_i_flg==1, it means that the punctured set Npunc_i is zero. The group-i as a whole is transmitted. However, if Punc_i_flg==0; the complete group-i is punctured.

For each group-i a pointer-set P_i is defined as:

$$P\_i = 0:Ns\_i:Nt\_i;$$

that is to say, P_i is the set of pointers: 0, Ns_i, 2Ns_i, . . . , Nt_i. It represents equal distance addresses of bits in the group-i with at least distance of 2.

A pseudo random number generator with a known seed S generates random displacements—for each of the pointers in the set P_i—that is between 0 and floor(½Ns_i). For example, if G(N) is a uniform random number that generates N random numbers between 0:1, the displacement D_i is given by:

$$Df\_i = (\tfrac{1}{2}Ns\_i) \cdot G(Nph\_i);$$

$$D\_i = \text{round}(Df\_i);$$

In the above, G(Nph_i) generates Nph_i numbers in the range between 0 to 1.

Therefore Df_i is a set of number between 0:½Ns_i. After the rounding D_i are random integers in the range 0, . . . ½Ns_i.

The final set of addresses A_i for each group i is given by:

$$A\_i(k) = P\_i(k) + D\_i(k); k=0, \ldots, Nph\_i-1;$$

That is to say, each address P_i(k) that is distanced Ns_i from its nearest neighbor Pi(k+1) is displaced by the amount D_i(k).

If Punc_i_flg==1, A_i is a set of addresses in the group-i that the bits it point to are punctured. If Punc_i_flg==0, A_i is a set of addresses in the group-i to bits that are selected to be transmitted.

Note that typically the number of groups is defined by the number of systematic groups plus the number of parity-groups which is dictated by the encoder structure. However, a more general partitioning may be applied. For example, in a network system where the SNR is reported the partitioning to groups may include this information by reducing (increasing) the puncturing rate at certain intervals of time—frequency.

In case of repetition we have Nh_i>Nt_i. That is to say, the encoder is producing lower number of bits than number of bits that may be transmitted (at group-i). It is noted that the technique represented herein may be applied to increase the number of bits transmitted.

In order for the receiver to perform de puncturing/de repetition the pseudo-random number generators at the receiver and the transmitter must be identical. Furthermore, their seed(s) must be also identical at each frame.

However, this issue may easily be resolved by pre-defining the random generator used and procedures used to initialize the seed. For example, at each new transmit packet the generator may set to some known parameter like clock time.

Figure 6:
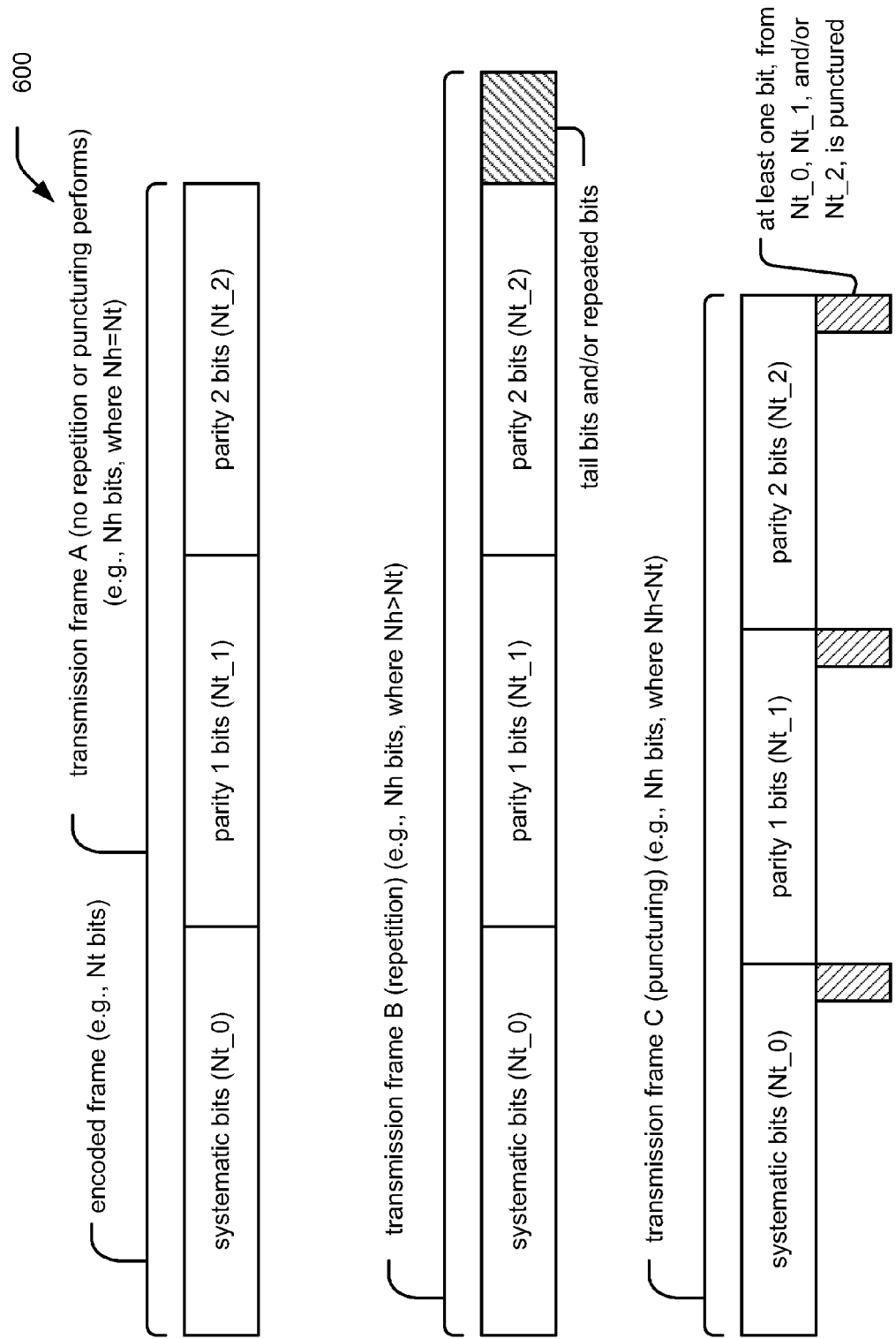
FIG. 6 illustrates an embodiment of possible relationships between an encoded frame and a transmission frame.

FIG. 6 illustrates an embodiment 600 of possible relationships between an encoded frame and a transmission frame. This embodiment 600 uses the various bits generated by a turbo encoder for illustration, though it is noted that any other type of coding may equally be employed in other embodiments without departing from the scope and spirit of the invention.

In accordance with turbo encoding, the turbo encoding generates systematic bits (shown as including Nt_0 bits), parity 1 bits (shown as including Nt_1 bits) (e.g., output from the first constituent encoder), and parity 2 bits (shown as including Nt_2 bits) (e.g., output from the second constituent encoder). Together, the systematic bits, parity 1 bits, and parity 2 bits may be viewed as forming an encoded frame having Nt bits.

The encoded frame may undergo rate matching processing in accordance with any one of a number of embodiments including no modification at all being made to the encoded frame in which a transmission frame A is output and eventually transmitted via a communication channel (e.g., after undergoing any appropriate modulation, symbol mapping, frequency conversion, gain adjustment, etc. to get the signal into a format that comports with the communication channel).

Alternatively, the encoded frame may be processed by repeating one or more bits selected from any one or more of the systematic bits, parity 1 bits, and parity 2 bits and adding those bits as tail bits to generate a transmission frame B [or placing the repeated bits elsewhere within a transmission frame B besides at the very end such as interspersing them among the transmission frame B] (e.g., in accordance with repetition).

In even another alternative embodiment, the encoded frame may be processed by puncturing one or more bits selected from any one or more of the systematic bits, parity 1 bits, and parity 2 bits to generate a transmission frame C (e.g., in accordance with puncturing).

Figure 7:
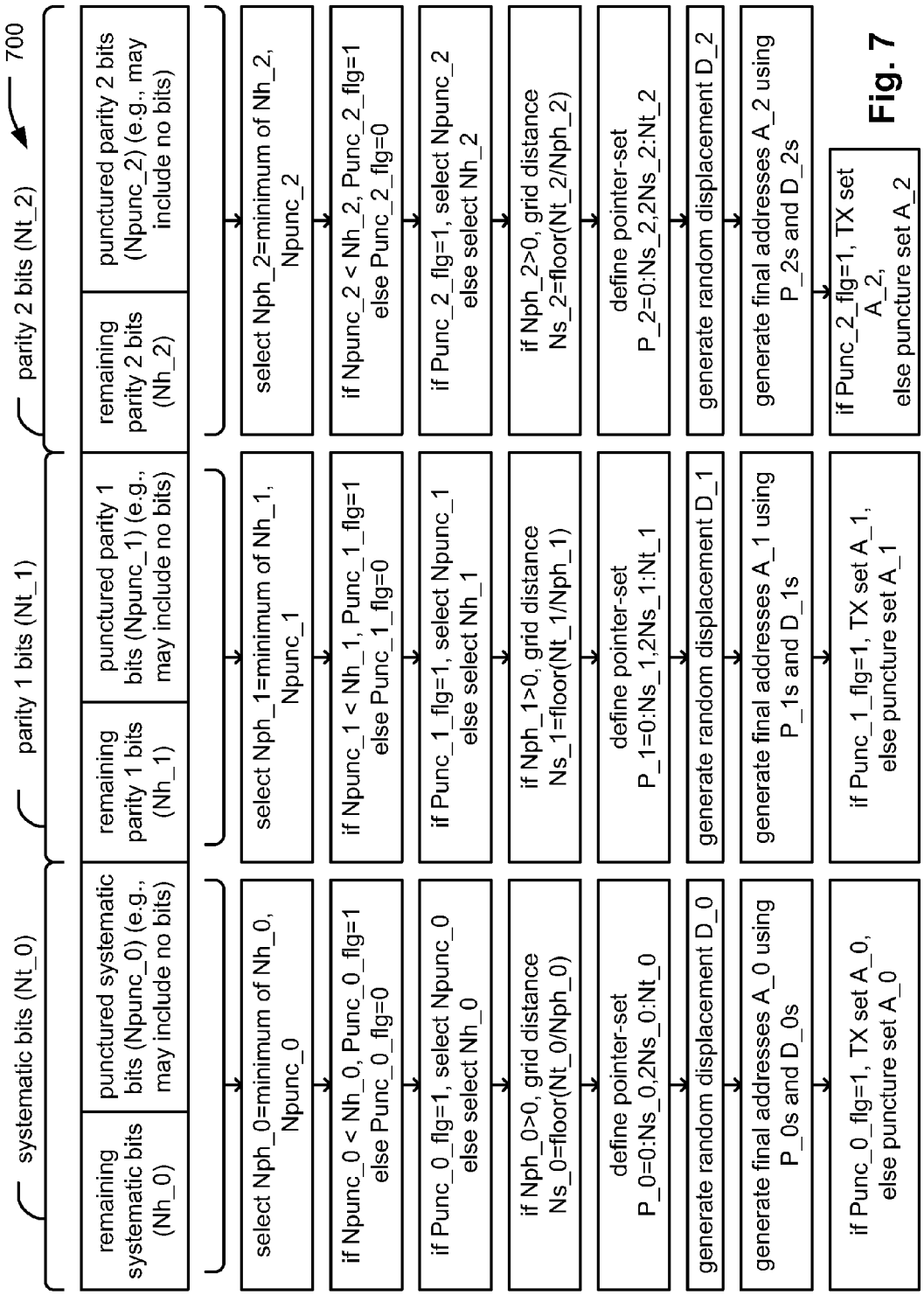
FIG. 7 illustrates an embodiment of an approach of performing rate matching.

FIG. 7 illustrates an embodiment 700 of an approach of performing rate matching. This embodiment 700 again uses the various bits generated in accordance with turbo encoding for illustration, though it is noted that any other type of coding may equally be employed in other embodiments without departing from the scope and spirit of the invention.

Again, in accordance with turbo encoding, the turbo encoding generates systematic bits (shown as including Nt_0 bits), parity 1 bits (shown as including Nt_1 bits) (e.g., output from the first constituent encoder), and parity 2 bits (shown as including Nt_2 bits) (e.g., output from the second constituent encoder).

Each of these 3 distinct groups of bits of the encoded frame (e.g., systematic bits (shown as including Nt_0 bits), parity 1 bits (shown as including Nt_1 bits) (e.g., output from the first constituent encoder), and parity 2 bits (shown as including Nt_2 bits)) undergo processing in accordance with the rate matching means presented herein. Detail is provided below for processing the systematic bits (shown as including Nt_0 bits) in accordance with rate matching, and the reader can follow from the diagram the analogous means by which the other groups of bits (e.g., parity 1 bits (shown as including Nt_1 bits), and parity 2 bits (shown as including Nt_2 bits)) undergo processing in accordance with rate matching.

Considering the systematic bits (shown as including Nt_0 bits), based on a predetermined rate parameter indicating a number of bits to be punctured from the systematic bits, the systematic bits are processed to partition the systematic bits into a remaining systematic bits and punctured systematic bits such that the remaining bits are eventually output (e.g., from a rate matching module).

If the number of systematic bits to be punctured is fewer bits than a number of remaining systematic bits that will be unpunctured, then the number corresponding to the remaining bits is selected. Alternatively, if the number of systematic bits to be punctured includes more bits or an equal number of bits than the number of remaining systematic bits that will be unpunctured, then the number corresponding to the punctured systematic bits is selected.

For each group-0, find the minimum:

$Nph\_0 = \min(Npunc\_0, Nh\_0)$

Note that Nph_0 is always less or equal ½Nt_0. It represents the total number of the group-0 to be transmitted or punctured.

In order to resolve this ambiguity, we define a flag Punc_0_flg:

if $Npunc\_0 < Nh\_0$, Punc_0_flg=1;

else Punc_0_flg=0;

The interpretation is that if Punc_0_flg==1; the punctured set in group-0 is the group to be selected. The rest will be transmitted. However, if Pun_0_flg==0; the transmitted set is the set to be selected.

A grid distance is generated based on a ratio of a number of bits of the encoded frame divided by the selected number (e.g., which corresponds to either the number of remaining systematic bits or the number of punctured systematic bits). For the systematic bits, this grid distance is defined as Ns_0. If Nph_0>0:

$Ns\_0 = \text{floor}(Nt\_0/Nph\_0)$ where floor is the function that returns the maximum integer of the ratio (Nt_0/Nph_0). As stated above Ns_0 is 2 or greater.

If Nph_0==0, then if Punc_0_flg==1, it means that the punctured set Npunc_0 is zero (e.g., no bits from the systematic bits get punctured). The group-0 as a whole is transmitted. However, if Punc_0_flg==0; the complete group-0 is punctured.

Pointers are then generated based on the grid distance, and random displacements are generated (e.g., using a random number generator with a given seed) such that each random displacement corresponds to one of the pointers.

For the group-0, a pointer-set P_0 is defined as:

$P\_0 = 0:Ns\_0:Nt\_0;$ that is to say, P_0 is the set of pointers: 0, Ns_0, 2Ns_0, . . . , Nt_0. It represents equal distance addresses of bits in the group-0 with at least distance of 2.

A pseudo random number generator with a known seed S generates random displacements—for each of point in the set P_0—that is between 0 and floor(½Ns_0). For example, if G(N) is a uniform random number that generates N random numbers between 0:1, the displacement D_0 is given by:

$$Df\_0\_=(\tfrac{1}{2}Ns\_0)\cdot G(Nph\_0);$$

$$D\_0=\mathrm{round}(Df\_0);$$

In the above, G(Nph_0) generates Nph_0 numbers in the range between 0 to 1.

Therefore Df_0 is a set of number between 0:½Ns_0. After the rounding D_0 are random integers: 0, ... ½Ns_0.

Thereafter, final addresses are generated using the pointers and the plurality of random displacements. These final addresses then correspond to bits that are either to be punctured or to be transmitted.

The final set of addresses A_0 for each group 0 is given by:

$$A\_0(k)=P\_0(k)+D\_0(k); k=0,\ldots,Nph\_0-1;$$

That is to say, each address P_0(k) that is distanced Ns_0 from its nearest neighbor Pi(k+1) is displaced by the amount D_0(k).

If Punc_0_flg==1, A_0 is a set of addresses in the group-i that the bits it point to are punctured. If Punc_0_flg==0, A_0 is a set of addresses in the group-i to bits that are selected to be transmitted.

In other words, if the number of systematic bits to be punctured is fewer than the number of remaining systematic bits that will be unpunctured, then the final addresses correspond to the punctured systematic bits. The remaining systematic bits are then identified as being unaddressed by these final addresses. These identified, remaining systematic bits are then output.

Alternatively, if the number of systematic bits to be punctured includes more bits or an equal number of bits than the number of remaining systematic bits that will be unpunctured, then the final addresses correspond to the remaining bits themselves, and they are then output.

The output remaining bits then may undergo any appropriate modulation, symbol mapping, frequency conversion, gain adjustment, etc. to generate a signal having a format that comports with a communication channel into which the signal is to be launched.

Figure 8:
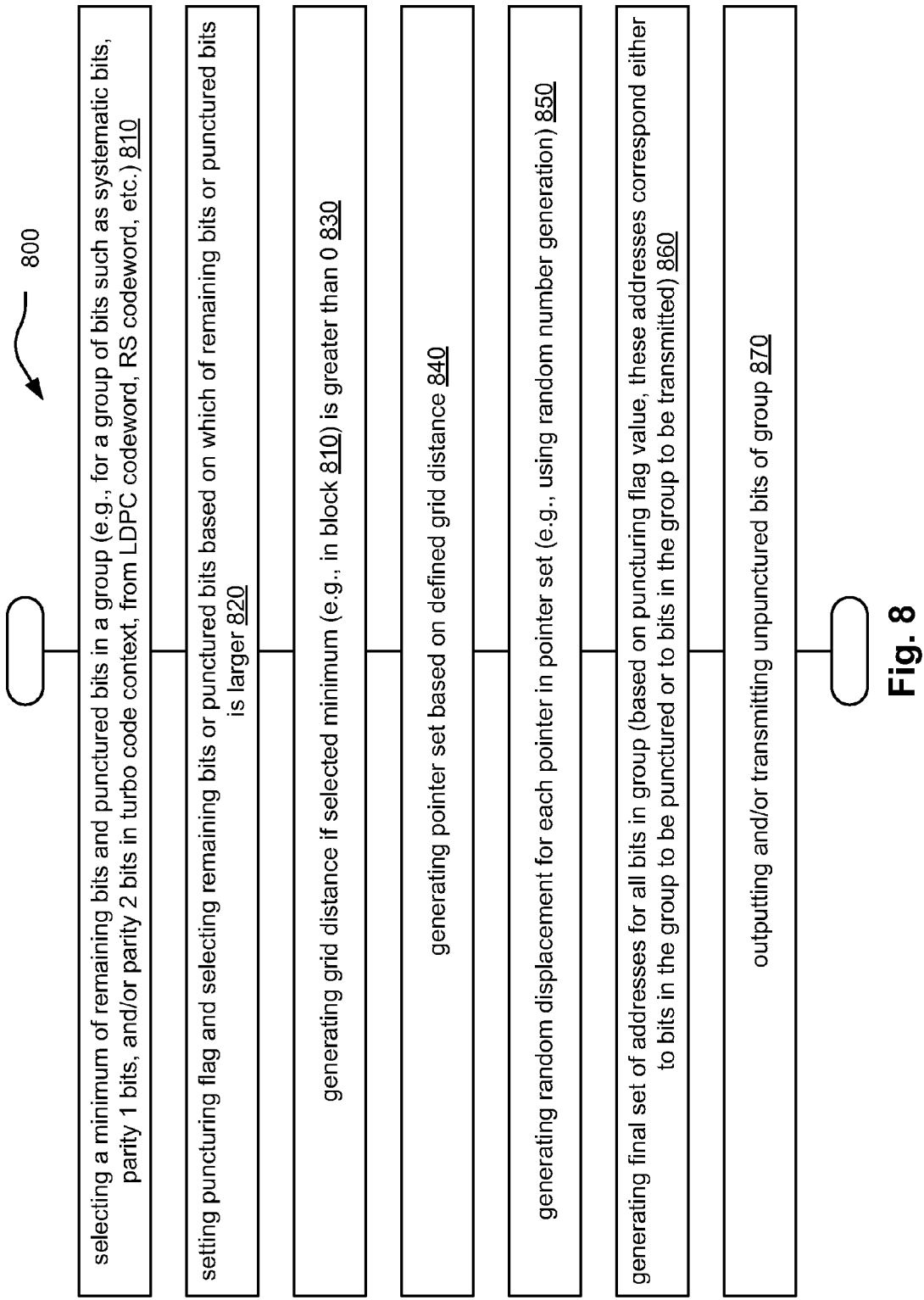
FIG. 8 illustrates an embodiment of a method for performing rate matching.

FIG. 8 illustrates an embodiment of a method 800 for performing rate matching. As shown in a block 810, the method operates by selecting a minimum of remaining bits and punctured bits in a group (e.g., for a group of bits such as systematic bits, parity 1 bits, and/or parity 2 bits in turbo code context, from LDPC (Low Density Parity Check) codeword, RS (Reed-Solomon) codeword, etc.). It is noted that the group of bits may be an entire codeword, code block, or any portion thereof without departing from the scope and spirit of the invention.

The method 800 continues by setting puncturing flag and selecting remaining bits or punctured bits based on which of remaining bits or punctured bits is larger, as shown in a block 820. The method 800 continues by generating grid distance if selected minimum (e.g., in block 810) is greater than 0, as shown in a block 830.

The method 800 continues by generating pointer set based on defined grid distance, as shown in a block 840. The method 800 continues by generating random displacement for each pointer in pointer set (e.g., using random number generation), as shown in a block 850.

The method 800 continues by generating final set of addresses for all bits in group (based on puncturing flag value, these addresses correspond either to bits in the group to be punctured or to bits in the group to be transmitted), as shown in a block 860. The method 800 continues by outputting and/or transmitting unpunctured bits of group, as shown in a block 870. These unpunctured bits of the group (i.e., the remaining bits of the group) may also undergo any appropriate modulation, symbol mapping, frequency conversion, gain adjustment, etc. to get the signal into a format that comports with a communication channel into which the signal is to be launched (e.g., transmitted as from a first communication device to a second communication device, etc).

Figure 9:
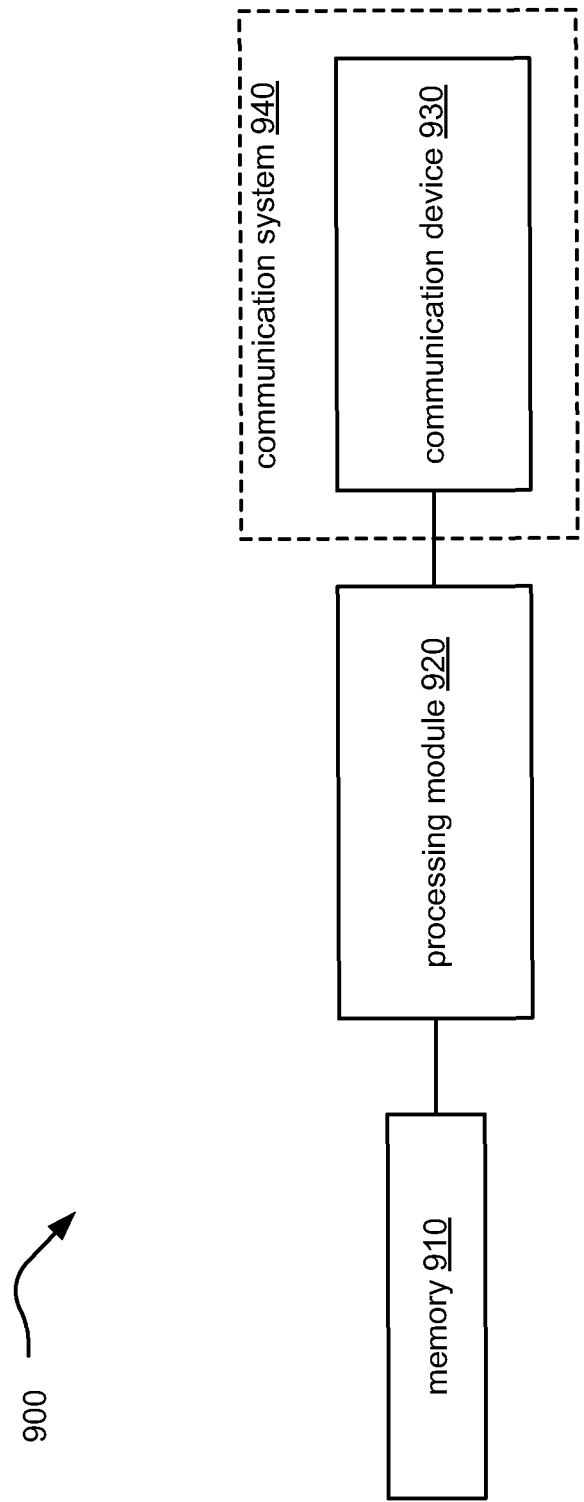
FIG. 9 illustrates an embodiment of an apparatus that is operable to perform encoding and/or decoding in conjunction with rate matching.

FIG. 9 illustrates an embodiment of an apparatus 900 that is operable to perform encoding and/or decoding in conjunction with rate matching. The encoding and/or decoding may be employ any type of code including a turbo code, an LDPC (Low Density Parity Check) code, a RS (Reed-Solomon) code, or other type of code.

The apparatus 900 includes a processing module 920, and a memory 910. The memory 910 is coupled to the processing module, and the memory 910 is operable to store operational instructions that enable the processing module 920 to perform a variety of functions. The processing module 920 is operable to perform and/or direct the manner in which encoding and/or decoding is to be performed in accordance with any embodiment described herein, or any equivalent thereof, including performing appropriate rate matching in accordance with certain aspects of the invention.

The processing module 920 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 910 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 920 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the encoding and/or decoding, rate matching, etc. is to be performed can be provided from the apparatus 900 to a communication system 940 that is operable to employ and perform encoding and/or decoding, rate matching, etc. For example, information corresponding to the type of encoding and/or decoding can also be provided from the processing module 920 to any of a variety of communication devices 930 implemented within the communication system 940 as well. In addition, the particular manner of performing rate matching to be employed when performing encoding can be provided from the processing module 920 to any of a variety of communication devices 930 implemented within the communication system 940 as well. In addition, the manner in which such encoding and/or decoding is to be performed within any of a variety of communication devices 930 implemented within the communication system 940 can also be provided from the processing module 920.

If desired, the apparatus 920 can be designed to generate multiple means of performing rate matching in accordance with encoding and/or decoding in accordance with multiple needs and/or desires as well. In some embodiments, the processing module 920 can selectively provide different information (e.g., corresponding to different types of rate matching employed in accordance with encoding, decoding, etc.) to different communication devices and/or communication systems. That way, different communication links between different communication devices can employ codes, different means of puncturing, and/or means by which to perform encoding and/or decoding. Clearly, the processing module 920 can also provide the same information to each of different communication devices and/or communication systems as well without departing from the scope and spirit of the invention.

Figure 10:
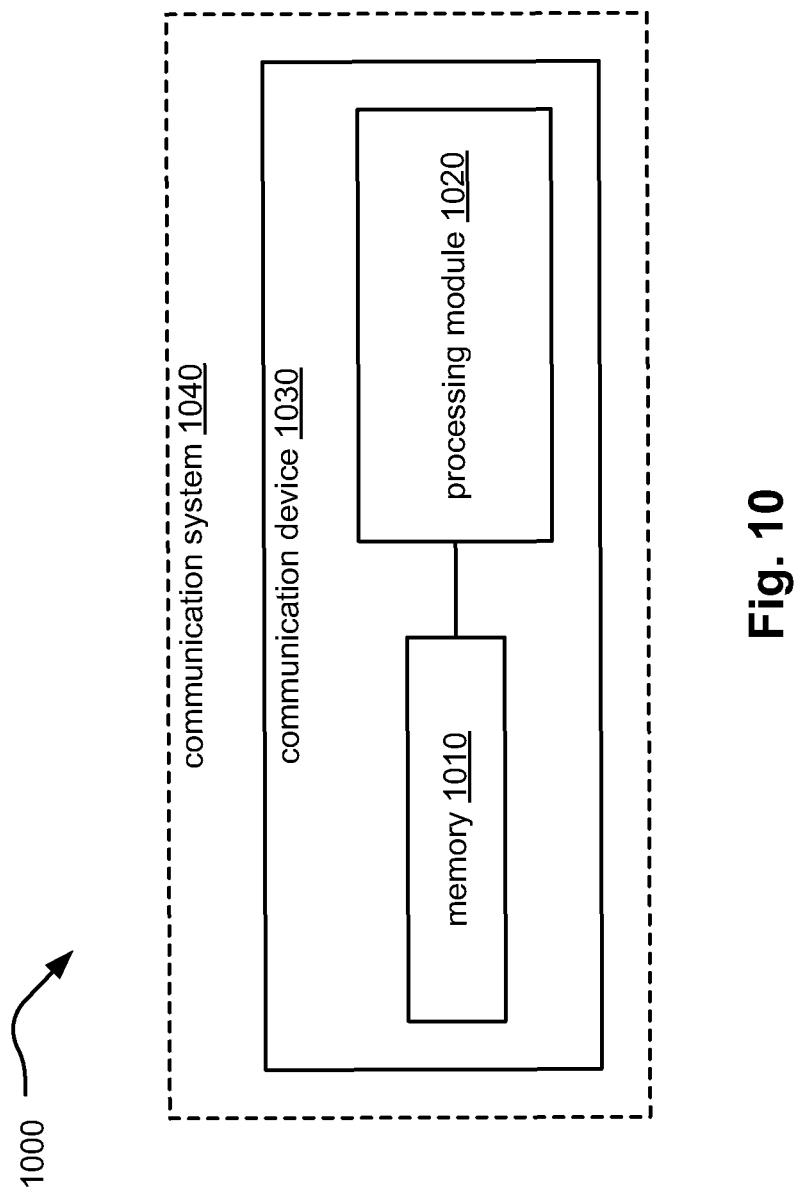
FIG. 10 illustrates an alternative embodiment of an apparatus that is operable to perform encoding and/or decoding in conjunction with rate matching.

FIG. 10 illustrates an alternative embodiment of an apparatus 1000 that is operable to perform encoding and/or decoding in conjunction with rate matching. The encoding and/or decoding may be employ any type of code including a turbo code, an LDPC (Low Density Parity Check) code, a RS (Reed-Solomon) code, or other type of code.

The apparatus 1000 includes a processing module 1020, and a memory 1010. The memory 1010 is coupled to the processing module, and the memory 1010 is operable to store operational instructions that enable the processing module 1020 to perform a variety of functions. The processing module 1020 (serviced by the memory 1020) can be implemented as an apparatus capable to perform any of the functionality of any of the various modules and/or functional blocks described herein. For example, the processing module 1020 (serviced by the memory 1020) can be implemented as an apparatus capable to perform and/or direct the manner in which encoding and/or decoding, rate matching, etc. is to be performed in accordance with any embodiment described herein, or any equivalent thereof, including performing appropriate rate matching in accordance with certain aspects of the invention.

The processing module 1020 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1010 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 1020 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 1000 can be any of a variety of communication devices 1030, or any part or portion of any such communication device 1030. Any such communication device that includes the processing module 1020 and/or memory 1010 can be implemented within any of a variety of communication systems 1040 as well. It is also noted that various embodiments of encoding and/or decoding as presented herein, and equivalents thereof, may be applied to many types of communication systems and/or communication devices.

Figure 11:
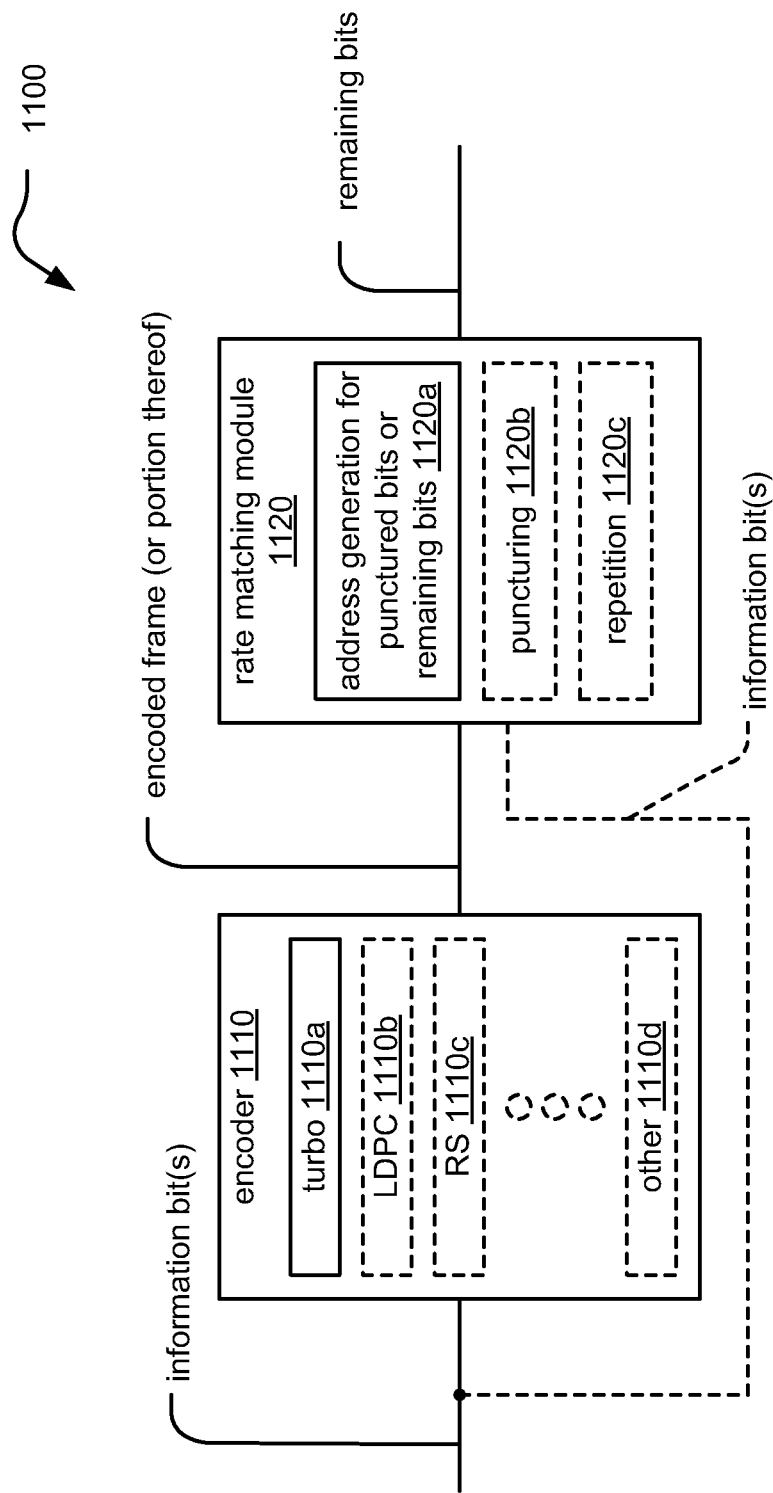
FIG. 11 illustrates an embodiment of an apparatus that is operable to perform encoding in conjunction with rate matching.

FIG. 11 illustrates an embodiment of an apparatus 1100 that is operable to perform encoding in conjunction with rate matching. This embodiment shows generally how the means of performing rate matching can be equally applied to any desired signal. For example, even a group of bits or frame of bits that has not been encoded may benefit from the rate matching as presented herein.

While some of the embodiments depicted herein illustrate rate matching being performed in accordance with the various groups of bits generated in accordance with turbo encoding (e.g., systematic bits, parity 1 bits, and parity 2 bits), it is noted that this means of performing rate matching can be applied as well to other encoded groups of bits, encoded frames, and/or codewords, generated by other types of encoders as well without departing from the scope and spirit of the invention.

An encoder 1110 is implemented to encode at least one information bit thereby generating an encoded frame. It is noted that the entire encoded frame may undergo processing in accordance with the rate matching as described herein, or any sub-portion of the encoded frame may undergo processing in accordance with the rate matching as described herein.

The encoder 1110 may be any type of encoder including a turbo encoder 1110*a* that generates systematic bits, parity 1 bits, and parity 2 bits. Alternatively, the encoder 1110 may be an LDPC (Low Density Parity Check) encoder 1110*b* that generates an LDPC codeword or code block. In even another embodiment, the encoder 1110 may be a RS (Reed-Solomon) encoder 1110*c* that generates a RS codeword. Any other type of encoder 1110*d* may equally be employed without departing from the scope and spirit of the invention.

Thereafter, a rate matching module 1120 processes the encoded frame, a portion of the encoded frame (e.g., a group of bits selected from the encoded frame), or the information bits themselves without having undergone any encoding. For the bits being processed by the rate matching module 1120 (which eventually get partitioned into punctured bits and remaining bits), the rate matching module 1120 performs address generation 1120*a* in accordance with the means presented herein such that the generated addresses correspond to the punctured bits or the remaining bits. The remaining bits, being identified as either the bits to which the addresses correspond or the bits to which the addresses do not correspond, are output from the rate matching module 1120.

It is noted that the rate matching module 1120 may perform puncturing 1120*b* in certain embodiments. Alternatively, the rate matching module 1120 may perform repetition 1120*c* in other embodiments in which the rate matching module 1120 outputs at least one bit of the remaining bits at least twice in accordance with repetition. For example, if additional bits (e.g., more than the remaining bits) are eventually to be transmitted from a communication device that includes the apparatus 1100, then any one or more the remaining bits may be repeated (e.g., output more than once) from the rate matching module 1120.

It is also noted that the various modules (e.g., encoding modules, decoding modules, rate matching modules, interleavers, de-interleavers, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

From certain perspectives, the present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
an encoder to encode at least one information bit to generate an encoded plurality of bits;
a rate matching module to:
  based on a predetermined rate parameter, select a plurality of punctured bits or a plurality of non-punctured or remaining bits, whichever includes a fewer number of bits, from the encoded plurality of bits;
  generate a plurality of final addresses based on a plurality of pointers based on a grid distance based on a ratio between the encoded plurality of bits and the selected plurality of punctured bits or the plurality of non-punctured or remaining bits;
  generate a plurality of random displacements such that each of the plurality of random displacements corresponding to a respective one of the plurality of pointers; and
  based on the plurality of final addresses and the plurality of random displacements, select a subset of bits from the selected plurality of punctured bits or the plurality of non-punctured or remaining bits; and
a transmitter to transmit, based on a redundancy version associated with a hybrid automatic request (HARQ) process:
  a signal corresponding to the subset of bits via a communication channel; and
  at least one additional signal corresponding to at least one additional subset of bits, selected from the selected plurality of punctured bits or the plurality of non-punctured or remaining bits, via the communication channel.

2. The apparatus of claim 1, wherein:
at least one of the signal and the at least one additional signal including at least one of the selected plurality of punctured bits or the plurality of non-punctured or remaining bits more than once in accordance with repetition.

3. The apparatus of claim 1, wherein:
the encoder is an LDPC (Low Density Parity Check) encoder; and
the encoded plurality of bits is an LDPC codeword or a portion of an LDPC codeword generated by the LDPC encoder.

4. The apparatus of claim 1, wherein:
the encoder is a RS (Reed-Solomon) encoder; and
the encoded plurality of bits is a RS codeword or a portion of a RS codeword generated by the RS encoder.

5. The apparatus of claim 1, wherein:
the apparatus being a communication device operative within at least one of a satellite communication system, a wireless communication system, a wired communication system, and a fiber-optic communication system.

6. An apparatus, comprising:
an encoder to encode at least one information bit to generate an encoded plurality of bits;
a rate matching module to:
  based on a predetermined rate parameter, select a plurality of punctured bits or a plurality of non-punctured or remaining bits, whichever includes a fewer number of bits, from the encoded plurality of bits;
  generate a plurality of final addresses based on a plurality of pointers based on a grid distance based on a ratio between the encoded plurality of bits and the selected plurality of punctured bits or the plurality of non-punctured or remaining bits; and
  based on the plurality of final addresses, select a subset of bits from the selected plurality of punctured bits or the plurality of non-punctured or remaining bits; and
a transmitter to transmit a signal corresponding to the subset of bits via a communication channel.

7. The apparatus of claim 6, wherein:
the rate matching module to generate a plurality of random displacements such that each of the plurality of random displacements corresponding to a respective one of the plurality of pointers; and
each of the plurality of final addresses is a function of a respective one of the plurality of pointers and a respective one of the plurality of random displacements.

8. The apparatus of claim 6, wherein:
based on a redundancy version associated with a hybrid automatic request (HARD) process, the transmitter to transmit at least one additional signal corresponding to at least one additional subset of bits, selected from the selected plurality of punctured bits or the plurality of non-punctured or remaining bits, via the communication channel.

9. The apparatus of claim 6, wherein:
the predetermined rate parameter indicating that no bits are to be punctured from the encoded plurality of bits;
the plurality of remaining bits including all of the encoded plurality of bits.

10. The apparatus of claim 6, wherein:
the signal including at least one of the selected plurality of punctured bits or the plurality of non-punctured or remaining bits more than once in accordance with repetition.

11. The apparatus of claim 6, wherein:
the encoder is an LDPC (Low Density Parity Check) encoder; and
the encoded plurality of bits is an LDPC codeword or a portion of an LDPC codeword generated by the LDPC encoder.

12. The apparatus of claim 6, wherein:
the encoder is a RS (Reed-Solomon) encoder; and
the encoded plurality of bits is a RS codeword or a portion of a RS codeword generated by the RS encoder.

13. The apparatus of claim 6, wherein:
the apparatus being a communication device operative within at least one of a satellite communication system, a wireless communication system, a wired communication system, and a fiber-optic communication system.

14. A method for operating a communication device, the method comprising:
encoding at least one information bit to generate an encoded plurality of bits;
based on a predetermined rate parameter, selecting a plurality of punctured bits or a plurality of non-punctured or remaining bits, whichever includes a fewer number of bits, from the encoded plurality of bits;
generating a plurality of final addresses based on a plurality of pointers based on a grid distance based on a ratio between the encoded plurality of bits and the selected plurality of punctured bits or the plurality of non-punctured or remaining bits;
based on the plurality of final addresses, selecting a subset of bits from the selected plurality of punctured bits or the plurality of non-punctured or remaining bits; and
via an output of the communication device, transmitting a signal corresponding to the subset of bits via a communication channel.

15. The method of claim 14, further comprising:
generating a plurality of random displacements such that each of the plurality of random displacements corresponding to a respective one of the plurality of pointers; and wherein:
each of the plurality of final addresses is a function of a respective one of the plurality of pointers and a respective one of the plurality of random displacements.

16. The method of claim 14, further comprising:
based on a redundancy version associated with a hybrid automatic request (HARD) process, transmitting at least one additional signal corresponding to at least one additional subset of bits, selected from the selected plurality of punctured bits or the plurality of non-punctured or remaining bits, via the communication channel.

17. The method of claim 14, wherein:
the signal including at least one of the selected plurality of punctured bits or the plurality of non-punctured or remaining bits more than once in accordance with repetition.

18. The method of claim 14, further comprising:
employing an low density parity check (LDPC) encoder for encoding the at least one information bit to generate the encoded plurality of bits.

19. The method of claim 14, further comprising:
employing a RS (Reed-Solomon) encoder for encoding the at least one information bit to generate the encoded plurality of bits.

20. The method of claim 14, wherein:
the method performed within a communication device operative within at least one of a satellite communication system, a wireless communication system, a wired communication system, and a fiber-optic communication system.

\* \* \* \* \*

UNITED STATES PATENT AND TRADEMARK OFFICE
CERTIFICATE OF CORRECTION

PATENT NO.        : 8,448,053 B2                              Page 1 of 1
APPLICATION NO.   : 13/457391
DATED             : May 21, 2013
INVENTOR(S)       : Uri M. Landau and Mark Kent It is certified that error appears in the above-identified patent and that said Letters Patent is hereby corrected as shown below:

In the Claims:
Col. 16, line 62, in claim 8: replace "(HARD)" with --(HARQ)--
Col. 18, line 15, in claim 16: replace "(HARD)" with --(HARQ)--

Signed and Sealed this
Twenty-fifth Day of March, 2014

Michelle K. Lee
*Deputy Director of the United States Patent and Trademark Office*